(12) United States Patent
Moon

(10) Patent No.: US 6,479,354 B2
(45) Date of Patent: Nov. 12, 2002

(54) SEMICONDUCTOR DEVICE WITH SELECTIVE EPITAXIAL GROWTH LAYER AND ISOLATION METHOD IN A SEMICONDUCTOR DEVICE

(75) Inventor: Hong Bae Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/819,448

(22) Filed: Mar. 28, 2001

(65) Prior Publication Data

US 2001/0014504 A1 Aug. 16, 2001

Related U.S. Application Data

(62) Division of application No. 09/490,035, filed on Jan. 21, 2000, now abandoned.

(30) Foreign Application Priority Data

Jul. 15, 1999 (KR) .............................................. 99-28720

(51) Int. Cl.⁷ ............................................. H01L 21/336
(52) U.S. Cl. ...................... 438/269; 438/341; 438/416; 438/429; 438/481
(58) Field of Search .................................. 438/481, 341, 438/416, 429, 478, 489, 442, 221, 222, 269, 424, 634

(56) References Cited

U.S. PATENT DOCUMENTS

| | | | | |
|---|---|---|---|---|
| 4,472,237 A | * | 9/1984 | Deslauriers et al. ...... | 148/DIG. 100 |
| 4,937,643 A | * | 6/1990 | Deslauriers et al. ........ | 257/409 |
| 4,980,306 A | | 12/1990 | Shimbo ........................ | 437/34 |
| 5,010,034 A | * | 4/1991 | Manoliu ............... | 148/DIG. 11 |
| 5,428,243 A | * | 6/1995 | Wylie .......................... | 257/588 |
| 5,527,723 A | * | 6/1996 | Witek et al. ................. | 438/212 |
| 5,627,395 A | * | 5/1997 | Witek et al. ................. | 257/347 |
| 5,696,019 A | | 12/1997 | Chang .......................... | 437/67 |
| 5,753,961 A | | 5/1998 | Tsuchiaki .................... | 257/510 |
| 5,756,390 A | | 5/1998 | Juengling et al. ........... | 438/439 |
| 5,780,343 A | | 7/1998 | Bashir ......................... | 438/269 |
| 5,821,145 A | | 10/1998 | Goo ............................. | 438/294 |
| 5,866,465 A | | 2/1999 | Doan et al. .................. | 438/424 |
| 5,963,822 A | | 10/1999 | Saihara et al. .............. | 438/481 |
| 6,362,510 B1 | * | 3/2002 | Gardner et al. ............. | 257/374 |
| 2001/0039092 A1 | * | 11/2001 | Morimoto et al. .......... | 438/270 |

OTHER PUBLICATIONS

Assous et al, "Suppression of the base–collector leakage current in intergrated Si/SiGe heterojunction bipolar transistors", May 1998, Journal of Vacuum Science Technology B 16 (3), American Vacuum Society. pp. 1740–1744.*

Bashir et al, "A Simple Process to Produce a High Quality Silicon Surface Prior to Selective Epitaxial Growth", Jul. 1995, IEEE Electron Device Letters, vol. 16, No. 7, IEEE, pp. 306–308.*

Bourland et al, "Silicon–on–insulator processes for the fabrication of novel nanostructures", Sep. 2001, Journal of Vacuum Science Technology, B 19 (5), American Vacuum Society, pp. 1995–1997.*

* cited by examiner

*Primary Examiner*—Michael S. Lebentritt
(74) *Attorney, Agent, or Firm*—Mills & Onello LLP

(57) ABSTRACT

A method of forming a semiconductor device with a SEG layer and isolating elements formed in the device includes forming an insulating layer for isolating elements on a silicon substrate. An open area is formed in the insulating layer to expose the surface of the silicon substrate by selectively etching the insulating layer. The open area in the insulating layer includes an inclined side wall at a positive angle of inclination. An epitaxial layer is selectively grown to have a top surface lower than the surface of the insulating layer, using the silicon exposed in the open area as a seed. A sacrificial oxide layer is formed on the surface of the silicon of the epitaxial growth, and the sacrificial oxide layer is then removed.

5 Claims, 3 Drawing Sheets

US 6,479,354 B2

SEMICONDUCTOR DEVICE WITH SELECTIVE EPITAXIAL GROWTH LAYER AND ISOLATION METHOD IN A SEMICONDUCTOR DEVICE

RELATED APPLICATIONS

This application is a divisional of U.S. patent application Ser. No. 09/490,035, filed on Jan. 21, 2000, now abandoned the contents of which are incorporated herein in their entirety by reference.

BACKGROUND OF THE INVENTION

1. Field of the Invention

The present invention relates to a semiconductor device with a Selective Epitaxial Growth (SEG) layer and a method of isolation in the device, and the invention particularly relates to a semiconductor device which achieves high integration and high density via formation of an active region by SEG of monocrystalline silicon in an open area formed at an insulating layer of the device.

2. Description of the Prior Art

Demand for highly integrated and dense semiconductor devices which include large numbers of extremely small devices is increasing rapidly. Conventionally, the local oxidation silicon (LOCOS) method is commonly used to isolate elements on a wafer. However, this approach suffers a drawback in that it experiences narrowing of active regions, commonly referred to as the "bird's beak" phenomenon. In order to overcome this drawback, the processes of polysilicon layer buffered (PLB), side wall masked isolation (SWAMI), shallow trench isolation (STI) and others have been suggested. These methods can solve the problem of the LOCOS method to a certain degree, but they have certain limitations, such as high complexity and the requirement of a more detailed design rule.

U.S. Pat. Nos. 5,821,145 and 5,780,343 disclose a method for isolating elements by a selective epitaxial growth (SEG) process. The method disclosed in these patents for isolating elements through the SEG process includes forming an open area at an insulating layer and then forming the active region by selective epitaxial growth of silicon in the open area. This method satisfies the highly detailed design rule, and the process is relatively simple.

However, the crystalline structure of the epitaxial layer is determined by the quality of a seed layer produced before the epitaxial layer. Therefore, the characteristics of the crystalline structure can vary according to conditions before and after the epitaxial process. The characteristics of the crystalline structure in turn can determine the characteristics of the elements to be formed in the device.

U.S Pat. No. 5,780,343 discloses various models of pre-process steps in this SEG process and the difference in the characteristics of elements of each model. In certain cases in which a side wall of an open area is formed in a straight fashion with vertical walls in an insulating layer, the insulating layer is stressed at the time of the epitaxial growth. Also, after the epitaxial growth, the characteristics of the elements can be affected adversely by surface lattice defects.

SUMMARY OF THE INVENTION

It is an object of the present invention to provide an approach to isolating elements of a semiconductor device, in which stresses induced in an insulating layer by SEG are reduced and void regions between the insulating layer and a silicon substrate are eliminated.

Another object of the present invention is to provide a method for isolating elements of a semiconductor device which can acquire an epitaxial layer of high quality by removing lattice defects on the surface of the epitaxial layer.

In one embodiment of the invention, the stresses in the insulating layer are reduced by etching the open area in the insulating layer with side walls having a positive angle of inclination. Also, in one embodiment, the surface defects on the epitaxial layer are removed by forming a sacrificial oxide layer on the surface of the epitaxial layer after the SEG process and then removing the sacrificial oxide layer.

In one aspect, the present invention is directed to a method for isolating elements in a semiconductor device. In accordance with the method of the invention, an insulating layer for isolating elements is formed on a silicon substrate. An open area exposing the surface of the silicon substrate is formed by selectively etching the insulating layer, such that a side wall of the insulating layer has a positive angle of inclination. An epitaxial layer is selectively grown having a surface at a height lower than a height of a surface of the insulating layer using the silicon exposed in the open area as a seed. A sacrificial oxide layer is formed on the surface of the silicon of the epitaxial growth, and the sacrificial oxide layer is then removed.

In one particular embodiment, the positive angle of inclination in the side wall of the open area is greater than 70° and less than 90°.

The device of the present invention includes a silicon semiconductor substrate over which is formed an isolating layer. The isolating layer includes an open area formed in the isolating layer. The open are includes at least one side wall having a positive angle of inclination. The device also includes an epitaxial layer grown from the silicon semiconductor substrate in the open area and formed on the isolating layer. The epitaxial layer provides an active region for producing an active element.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS OF THE INVENTION

Figure 1:
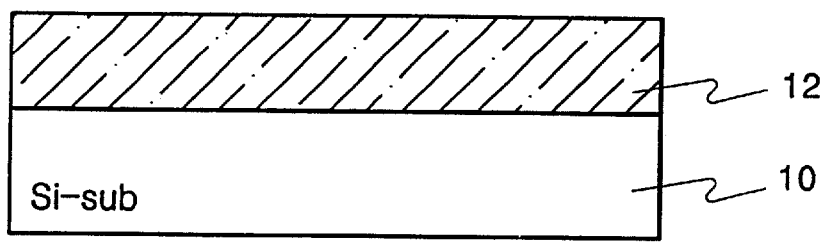
FIGS. 1 to 6 contain schematic cross-sectional diagrams illustrating formation of a semiconductor device according to one embodiment of the present invention.

Referring to FIG. 1, an insulating layer 12 such as, for example, an oxide layer, for isolating elements is formed at a predetermined thickness on a silicon substrate 10. The oxide layer 12 can be produced by thermal oxidation or by a chemical vapor deposition (CVD) deposit process. The oxide layer 12 is formed at the proper thickness determined by the required characteristics of the circuit elements to be formed. In one embodiment, the thickness is between 5,000Å and 10,000Å.

Figure 2:
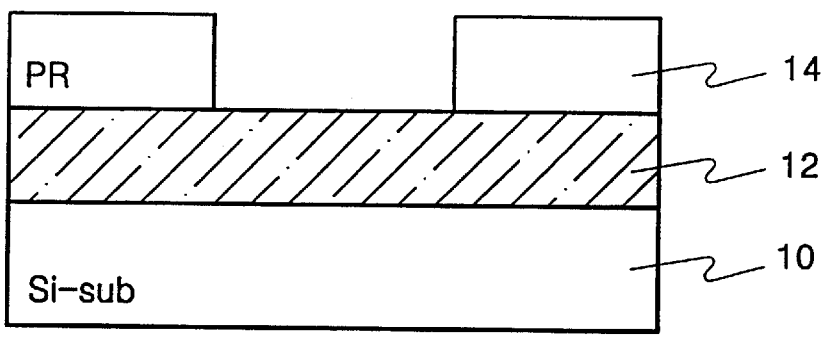

Referring to FIG. 2, photoresist (PR) is spread on the insulating layer 12 at a predetermined thickness, and a photoresist pattern 14 is formed to define an active region and an isolation region by subsequent exposure and development photolithography steps. That is, the open area is formed at the photoresist to define the active region.

Figure 3:
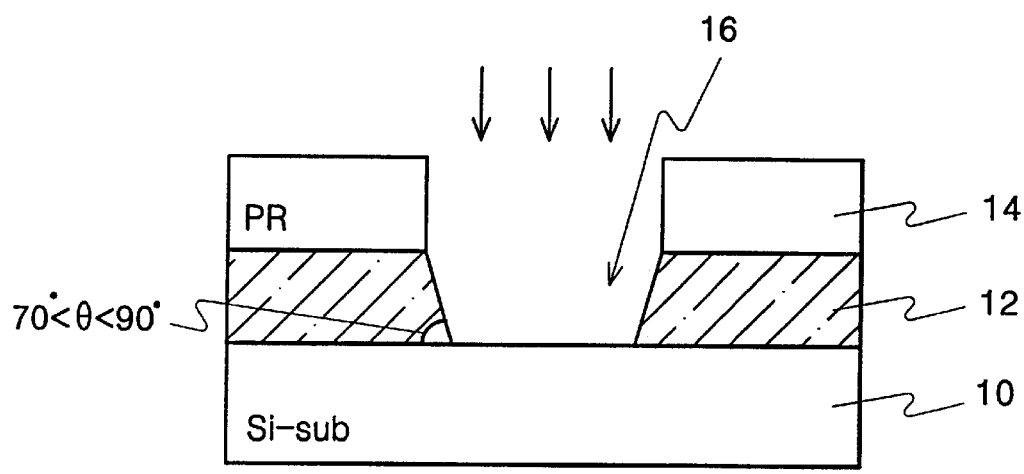

Referring to FIG. 3, the insulating layer 12 is primarily etched using the photoresist pattern 14 as an etching mask. The etching process primarily forms the open area 16 to expose the surface of the silicon substrate 10 by anisotropic etching ($CHR_3/O_2$ gas and $CF_4/Ar$ gas). A side wall of the open area 16 is formed at a positive angle of inclination, which in one embodiment is greater than 70° and less than 90°. The angle of inclination can be varied according to the thickness of the insulating layer 12 and the growing rate of the epitaxial layer.

Next, a secondary isotropic etching is performed to eliminate the damage on the surface of the silicon caused by the primary etching. In one embodiment, the isotropic etching is performed using plasma dry etching which employs $CF_4$ gas as an etchant. Alternatively, wet etching which employs $NH_4OH:H_2O$ solution as an etchant can be performed.

The surface of the silicon can be annealed instead of performing the secondary etching to eliminate the damage on the surface of the silicon after the primary etching. The annealing can be carried out at a temperature of 1,000~1,200° C., and in one particular embodiment, at 1,000~1,150° C., in an atmosphere of $N_2$ gas, using a diffusion process or a rapid temperature annealing (RTA) method.

Figure 4:
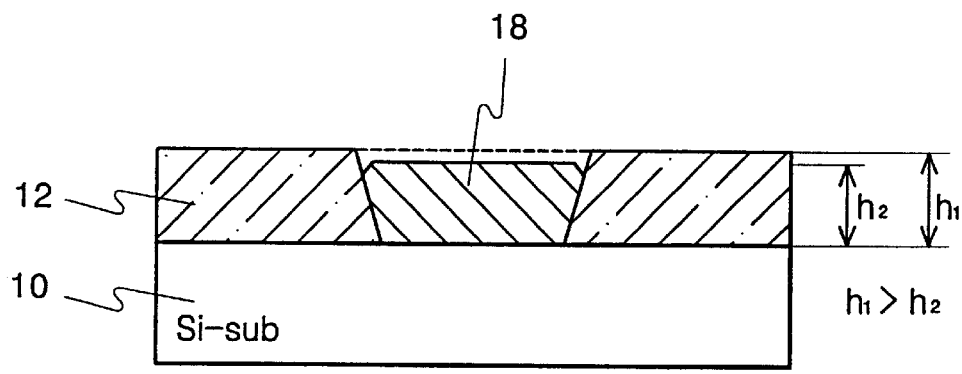

Referring to FIG. 4, the surface of the silicon is polished with SC1 ($NH_4OH:H_2O_2:H_2O$) solution to remove the photoresist pattern 14 and particles. Then the native oxide layer is removed by a diluted solution of HF. After carrying out the pre-process of etching at a temperature of 1,150° C. in an atmosphere of HCl 0.9 slm gas for 10 seconds, the silicon gas of 300 sccm is implanted into the silicon at a temperature of 1,100° C., and epitaxial growth proceeds on the silicon for several minutes. At this time, the epitaxial layer 18 of the monocrystalline silicon, which is formed in the open area 16, grows at a lower height (h2) than the height (h1) of the insulating layer 12.

Figure 5:
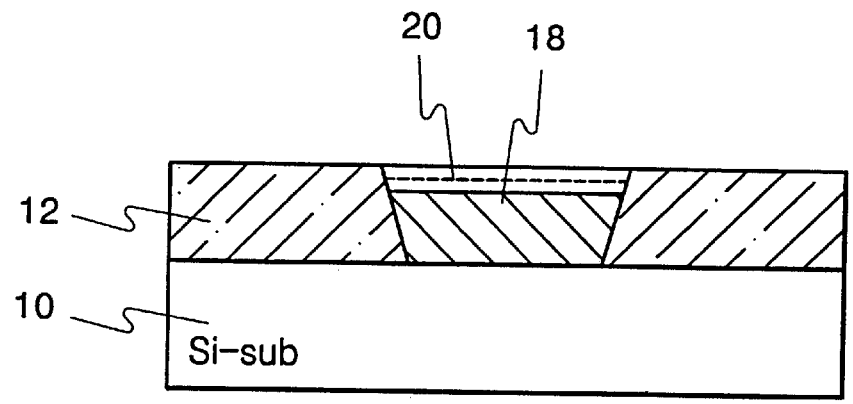

Referring to FIG. 5, a sacrificial oxide layer 20 is formed on the epitaxial layer 18 by performing a dry or wet oxidation process. The sacrificial oxide layer 20 is formed such that 55% of the layer 20 is formed on the upper side of the epitaxial layer 18 and 45% of the layer 20 is formed on the lower side of the epitaxial layer 18.

Figure 6:
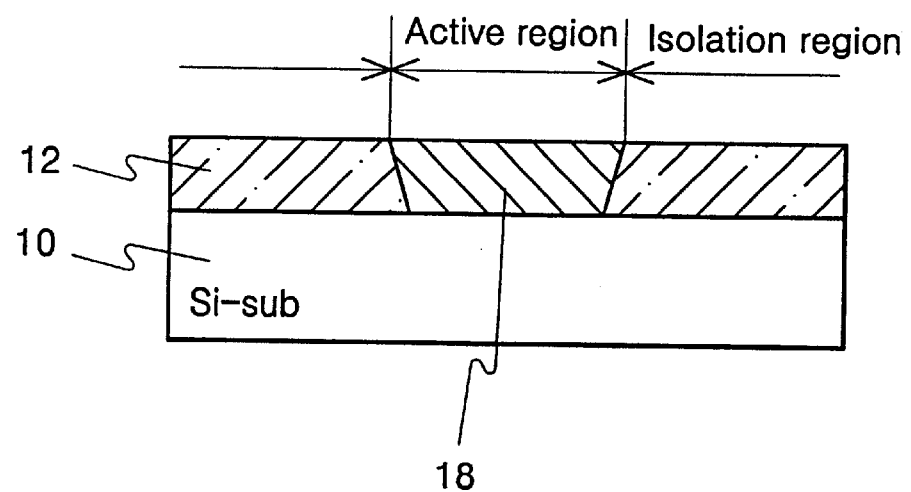

Referring to FIG. 6, the sacrificial oxide layer 20 is removed by wet etching using a SBOE (sulfuric buffered oxide etchant; $NH_4F:HF:H_2O$) solution. Accordingly, the SEG silicon region is provided as the active region, and multiple active regions are isolated from each other by the insulating layer 12 which surrounds the active regions. The sacrificial oxide layer 20 can be removed by a chemical mechanical polishing (CMP) process. By using the CMP process, the topology of the semiconductor device can be improved because the active region and the isolation region are formed flat.

Surface lattice defects or impurities in the epitaxial layer of the monocrystalline silicon can be eliminated by removing the sacrificial oxide layer formed after the SEG process.

As described above, the side wall of the open area 16, which has the epitaxial growth, is formed at a positive angle of inclination. As a result, it is possible to prevent flaws in the insulating layer due to the stress applied thereto by the growth of the epitaxial layer in the open area at the time of the epitaxial growth. Consequently, the reliability of the elements is improved according to the present invention. Also, the sacrificial oxide layer at the monocrystalline silicon having the epitaxial growth can eliminate surface lattice defects or imperfections and impurities. Accordingly, the reliability of the elements can be improved since the elements are formed on the surface of the high-quality silicon. While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for isolating circuit elements in a semiconductor device comprising:

forming an insulating layer on a silicon substrate;

forming an open area exposing a surface of said silicon substrate by selectively etching said insulating layer such that a side wall of said open area has a positive angle of inclination;

performing one of a plasma isotropic etching of the exposed surface of the silicon substrate in an atmosphere of $CF_4$ gas and wet etching of the exposed surface of the silicon substrate with an $NH_4OH:H_2O$ solution after the open area is formed;

selectively growing an epitaxial layer having a surface at a height lower than a height of a surface of said insulating layer, using the silicon exposed in said open area as a seed;

forming a sacrificial oxide layer on the surface of said epitaxial layer; and removing said sacrificial oxide layer.

2. The method as claimed in claim 1, wherein the positive angle of inclination of the side wall at said open area is greater than 70° and less than 90°.

3. The method as claimed in claim 1, wherein the exposed surface of the silicon substrate is pre-process etched at a temperature of about 1150° C. in an atmosphere of HCl gas for about 10 seconds before the epitaxial layer is grown.

4. The method as claimed in claim 1, wherein removing the sacrificial oxide layer comprises chemical mechanical polishing the insulating layer and the epitaxial layer.

5. The method as claimed in claim 1, wherein said insulating layer is at least one of an oxide layer and a nitride layer.

* * * * *